United States Patent
Sleator et al.

(10) Patent No.: US 9,718,193 B1
(45) Date of Patent: Aug. 1, 2017

(54) ROTARY TRANSFORMER

(71) Applicant: X Development LLC, Mountain View, CA (US)

(72) Inventors: Michael George Sleator, Woodside, CA (US); Eric Holland, Sunnyvale, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 14/963,541

(22) Filed: Dec. 9, 2015

(51) Int. Cl.
| | |
|---|---|
| *H01F 27/28* | (2006.01) |
| *B25J 13/08* | (2006.01) |
| *H03D 3/02* | (2006.01) |
| *H03C 3/12* | (2006.01) |
| *H03L 7/08* | (2006.01) |
| *H03B 5/12* | (2006.01) |
| *H03M 5/12* | (2006.01) |
| *B25J 13/02* | (2006.01) |

(52) U.S. Cl.
CPC .......... *B25J 13/087* (2013.01); *B25J 13/025* (2013.01); *H01F 27/28* (2013.01); *H03B 5/1237* (2013.01); *H03C 3/12* (2013.01); *H03D 3/02* (2013.01); *H03L 7/08* (2013.01); *H03M 5/12* (2013.01)

(58) Field of Classification Search
CPC .... H01F 38/18; H01F 38/14; H01F 2038/143; H01F 2038/146; H01F 21/06; H01F 27/02; H01F 29/04
USPC ............ 324/207.25, 207.16, 207.24, 207.17; 307/9.1, 10.1, 104, 134; 340/438, 461, 340/854.4, 854.9
See application file for complete search history.

(56) References Cited

U.S. PATENT DOCUMENTS

| | | | | |
|---|---|---|---|---|
| 3,824,857 | A | * 7/1974 | Smith | .................... G01K 13/08 322/100 |
| 4,450,443 | A | * 5/1984 | Dolland | ............... G01D 5/2046 318/657 |
| 5,347,256 | A | 9/1994 | Yumiki et al. | |
| 5,675,449 | A | * 10/1997 | Sano | ........................ G11B 5/53 360/281 |
| 8,542,085 | B2 | 9/2013 | Stancu et al. | |
| 8,847,718 | B2 | 9/2014 | Masters et al. | |
| 2010/0066340 | A1 | * 3/2010 | Delforge | .................. A61B 6/56 323/305 |

(Continued)

*Primary Examiner* — John Poos
(74) *Attorney, Agent, or Firm* — McDonnell Boehnen Hulbert & Berghoff LLP

(57) ABSTRACT

Example implementations may relate to a rotary transformer configured to transmit data. In some implementations, the rotary transformer may include a primary transformer component with a primary winding magnetically coupled to a secondary transformer component with a secondary winding. The rotary transformer may also include a resonant circuit including a frequency determining element and an amplifier. The frequency determining element may consist of the primary and secondary windings connected in parallel to respective capacitors. The primary transformer component may be coupled to a fixed-frequency signal generator. The rotary transformer may include a modulator coupled to the secondary transformer component and configured to vary the phase of the resonant circuit to generate an output signal and a demodulator coupled to the primary transformer component and configured to demodulate the output signal.

21 Claims, 11 Drawing Sheets

(56) References Cited

U.S. PATENT DOCUMENTS

2015/0377741 A1* 12/2015 Stein ................... G01M 17/02
307/9.1

* cited by examiner

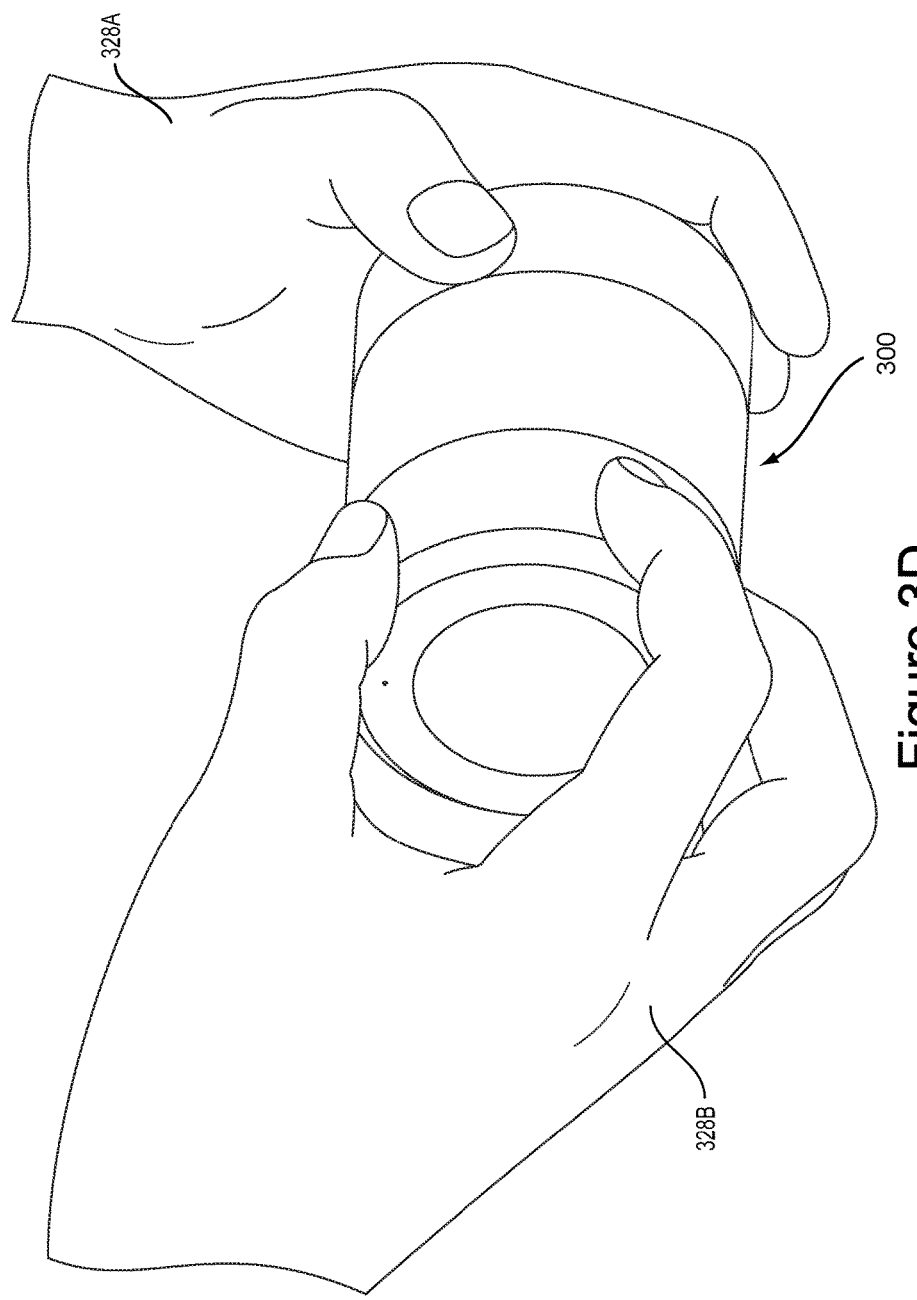

ROTARY TRANSFORMER

BACKGROUND

Robotic systems may be used for applications involving material handling, welding, assembly, and dispensing, among others. Over time, the manner in which these robotic systems operate is becoming more intelligent, more efficient, and more intuitive. As robotic systems become increasingly prevalent in numerous aspects of modern life, the need for robotic systems capable of working alongside humans becomes apparent. Therefore, a demand for such robotic systems has helped open up a field of innovation in controllers, sensing techniques, as well as component design and assembly.

SUMMARY

Example implementations relate to a rotary transformer used to couple electrical signals between two parts that rotate relative to each other via magnetic coupling of a primary winding and a secondary winding. For the purposes of this application, the stationary side of the rotary transformer will be referred to as the primary side and the rotating side of the rotary transformer will be referred to as the secondary side of the transformer. With this arrangement, the secondary side may send an electrical signal (e.g., a power signal, a sensor signal, another output signal, or multiple signals) to the primary side via the magnetic coupling of the transformer windings. Additionally or alternatively, the primary side may send a signal to the secondary side via the magnetic coupling of the transformer windings.

In one aspect, a rotary transformer is provided. The rotary transformer includes a primary transformer component with a primary winding and a secondary transformer component with a secondary winding. The secondary transformer component is configured to rotate relative to the primary transformer component about an axis. The primary winding is configured to magnetically couple to the secondary winding. The rotary transformer also includes a fixed-frequency signal generator coupled to the primary transformer component. The rotary transformer includes a resonant circuit with a frequency determining element and an amplifier. The frequency determining element includes (i) a first capacitor connected in parallel to the primary winding and (ii) a second capacitor connected in parallel to the secondary winding. The rotary transformer includes a modulator coupled to the secondary transformer component and configured to vary the phase of the resonant circuit to generate an output signal. The rotary transformer also includes a demodulator coupled to the primary transformer component and configured to demodulate the output signal.

In another aspect, a rotary transformer is provided. The rotary transformer includes a primary transformer component with a primary winding and a secondary transformer component with a secondary winding. The secondary transformer component is configured to rotate relative to the primary transformer component about an axis. The primary winding is configured to magnetically couple to the secondary winding. The rotary transformer also includes a fixed-frequency signal generator coupled to the primary transformer component. The rotary transformer includes a resonant circuit with a frequency determining element and an amplifier. The frequency determining element includes (i) a first capacitor connected in parallel to the primary winding and (ii) a second capacitor connected in parallel to the secondary winding. The rotary transformer includes a modulator coupled to the secondary transformer component and configured to vary the frequency of the frequency determining element to generate an output signal. The rotary transformer also includes a demodulator coupled to the primary transformer component and configured to demodulate the output signal.

In another aspect, a method is provided. The method includes magnetically coupling a primary winding of a primary transformer component to a secondary winding of a secondary transformer component. The method includes generating a fixed-frequency signal at the primary transformer component. The method includes varying the phase of a resonant circuit to generate an output signal via a modulator coupled to the secondary transformer component, wherein the resonant circuit comprises a frequency determining element and an amplifier, wherein the frequency determining element comprises (i) a first capacitor connected in parallel to the primary winding and (ii) a second capacitor connected in parallel to the secondary winding. The method also includes demodulating the output signal via a demodulator coupled to the primary transformer.

These as well as other aspects, advantages, and alternatives will become apparent to those of ordinary skill in the art by reading the following detailed description, with reference where appropriate to the accompanying drawings.

BRIEF DESCRIPTION OF THE DRAWINGS

FIGS. 3A, 3B, 3C, and 3D illustrate an example hand-holdable controller, according to an example implementation.

DETAILED DESCRIPTION

Example methods and systems are described herein. It should be understood that the words "example," "exemplary," and "illustrative" are used herein to mean "serving as an example, instance, or illustration." Any implementation or feature described herein as being an "example," being "exemplary," or being "illustrative" is not necessarily to be construed as preferred or advantageous over other implementations or features. The example implementations described herein are not meant to be limiting. It will be readily understood that the aspects of the present disclosure, as generally described herein, and illustrated in the figures, can be arranged, substituted, combined, separated, and designed in a wide variety of different configurations, all of which are explicitly contemplated herein.

I. Overview

According to various implementations, described herein is a rotary transformer for power transfer and/or data signaling between a stationary component and a rotatable component. In particular, an example implementation may involve a hand-holdable controller that includes a knob as well as touch sensors (e.g., a curved touchpad) coupled to the rotatable knob. Rotation of the knob and touch data received from the touch sensors may collectively generate input data that represents intended control actions provided by a user holding the controller. Further, a motor may be configured to apply torque-generating force to the knob, so as to provide haptic feedback. A rotary transformer may be configured such that the primary transformer component is the stationary controller base, the stationary transformer component is the rotatable knob, and the resonant element is split across the base and the rotatable knob.

In some implementations, the rotary transformer may be split across a joint in a robotic arm. For example, the rotary transformer may be used in a robotic joint in combination with sensors (e.g., torque sensors or laser scanners) to sense information and transmit that information (e.g., torque signal or distance and ranging information).

A computing device, such as a tablet, may receive input data from the controller and may interpret the input data to determine specific intended operations of a robotic system. Upon processing the input data to determine a particular interpretation, the computing device may send commands to a robotic system (or to another device) in order to cause the robotic system to carry out intended operations of various components such as actuators coupled to joints, end effectors, appendages, speakers, and/or light sources, among others.

II. Illustrative Systems

Figure 1A:
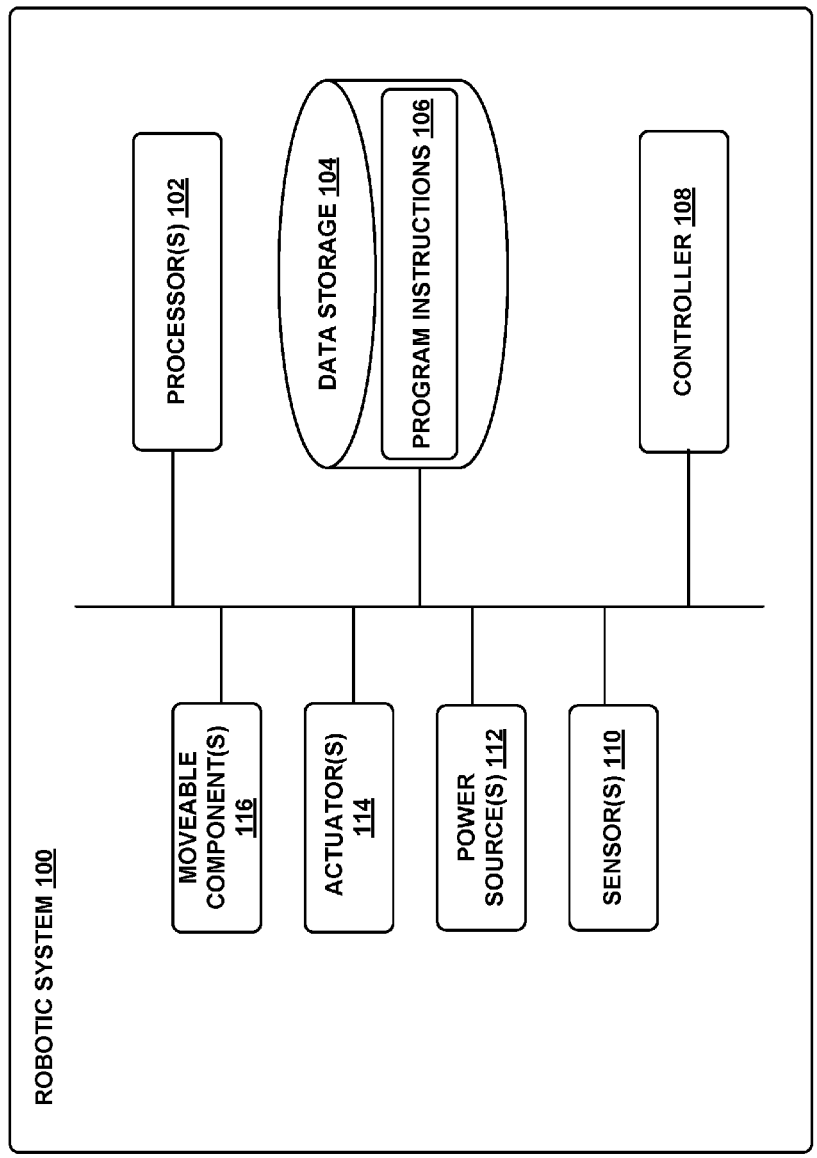
FIGS. 1A and 1B illustrate an example robotic system, according to an example implementation.

Referring now to the figures, FIG. 1A shows an example configuration of a robotic system 100. Robotic system 100 may be any device that has a computing ability and interacts with its surroundings with an actuation capability and/or with ability to emit/generate physical phenomena such as light and/or sound, among others. For instance, the robotic system 100 may be a robotic arm, a humanoid robot, or a quadruped robot, among others. In other examples, robotic system 100 may define a vehicle, a watch, a washing machine, actuated blinds, a conveyer belt, a speaker, or a light bulb, among many other examples. Additionally, the robotic system 100 may also be referred to as a robotic device, a robotic manipulator, or a robot, among others.

The robotic system 100 is shown to include processor(s) 102, data storage 104, program instructions 106, controller 108, sensor(s) 110, power source(s) 112, actuator(s) 114, and movable component(s) 116. Note that the robotic system 100 is shown for illustration purposes only and robotic system 100 may include additional components and/or have one or more components removed without departing from the scope of the disclosure. Further, note that the various components of robotic system 100 may be arranged and connected in any manner.

Processor(s) 102 may be a general-purpose processor or a special purpose processor (e.g., digital signal processors, application specific integrated circuits, etc.). The processor(s) 102 can be configured to execute computer-readable program instructions 106 that are stored in the data storage 104 and are executable to provide the functionality of the robotic system 100 described herein. For instance, the program instructions 106 may be executable to provide functionality of controller 108, where the controller 108 may be configured to instruct an actuator 114 to cause movement of one or more movable component(s) 116.

The data storage 104 may include or take the form of one or more computer-readable storage media that can be read or accessed by processor(s) 102. The one or more computer-readable storage media can include volatile and/or non-volatile storage components, such as optical, magnetic, organic or other memory or disc storage, which can be integrated in whole or in part with processor(s) 102. In some implementations, the data storage 104 can be implemented using a single physical device (e.g., one optical, magnetic, organic or other memory or disc storage unit), while in other implementations, the data storage 104 can be implemented using two or more physical devices. Further, in addition to the computer-readable program instructions 106, the data storage 104 may include additional data such as diagnostic data, among other possibilities.

The robotic system 100 may include one or more sensor(s) 110 such as force sensors, proximity sensors, load sensors, position sensors, touch sensors, depth sensors, ultrasonic range sensors, infrared sensors, Global Positioning System (GPS) receivers, sonar, optical sensors, biosensors, Radio Frequency identification (RFID) sensors, Near Field Communication (NFC) sensors, wireless sensors, compasses, smoke sensors, light sensors, radio sensors, microphones, speakers, radar, cameras (e.g., color cameras, grayscale cameras, and/or infrared cameras), depth sensors (e.g., Red Green Blue plus Depth (RGB-D), lasers, structured-light, and/or a time-of-flight camera), motion sensors (e.g., gyroscope, accelerometer, inertial measurement unit (IMU), and/or foot step or wheel odometry), and/or range sensors (e.g., ultrasonic and/or infrared), among others. The sensor(s) 110 may provide sensor data to the processor(s) 102 to allow for appropriate interaction of the robotic system 100 with the environment. Additionally, the robotic system 100 may also include one or more power source(s) 112 configured to supply power to various components of the robotic system 100. Any type of power source may be used such as, for example, a gasoline engine or a battery.

The robotic system 100 may also include one or more actuator(s) 114. An actuator is a mechanism that may be used to introduce mechanical motion. In particular, an actuator may be configured to convert stored energy into movement of one or more components. Various mechanisms may be used to power an actuator. For instance, actuators may be powered by chemicals, compressed air, or electricity, among other possibilities. In some cases, an actuator may be a rotary actuator that may be used in systems involving rotational forms of motion (e.g., a joint in robotic system 100). In other cases, an actuator may be a linear actuator that may be used in systems involving straight line motion. In either case, actuator(s) 114 may cause movement of various movable component(s) 116 of the robotic system 100. The moveable component(s) 116 may include appendages such as robotic arms, legs, and/or hands, among others. The moveable component(s) 116 may also include a movable base, wheels, and/or end effectors, among others.

The above description of processor(s) 102, data storage 104, program instructions 106, sensor(s) 110, and power source(s) 112 may apply to any discussion below relating to the respective component being used in another system or arrangements. For instance, FIGS. 2A and 3A (among other possible figures) illustrate processors, data storage, program instructions, sensors, and/or power sources as being incorporated in other arrangement. These components at issue may thus take on the same or similar characteristics (and/or form) as the respective components discussed above in association with FIG. 1A. However, the components at issue could also take on other characteristics (and/or form) without departing from the scope of the disclosure.

Figure 1B:
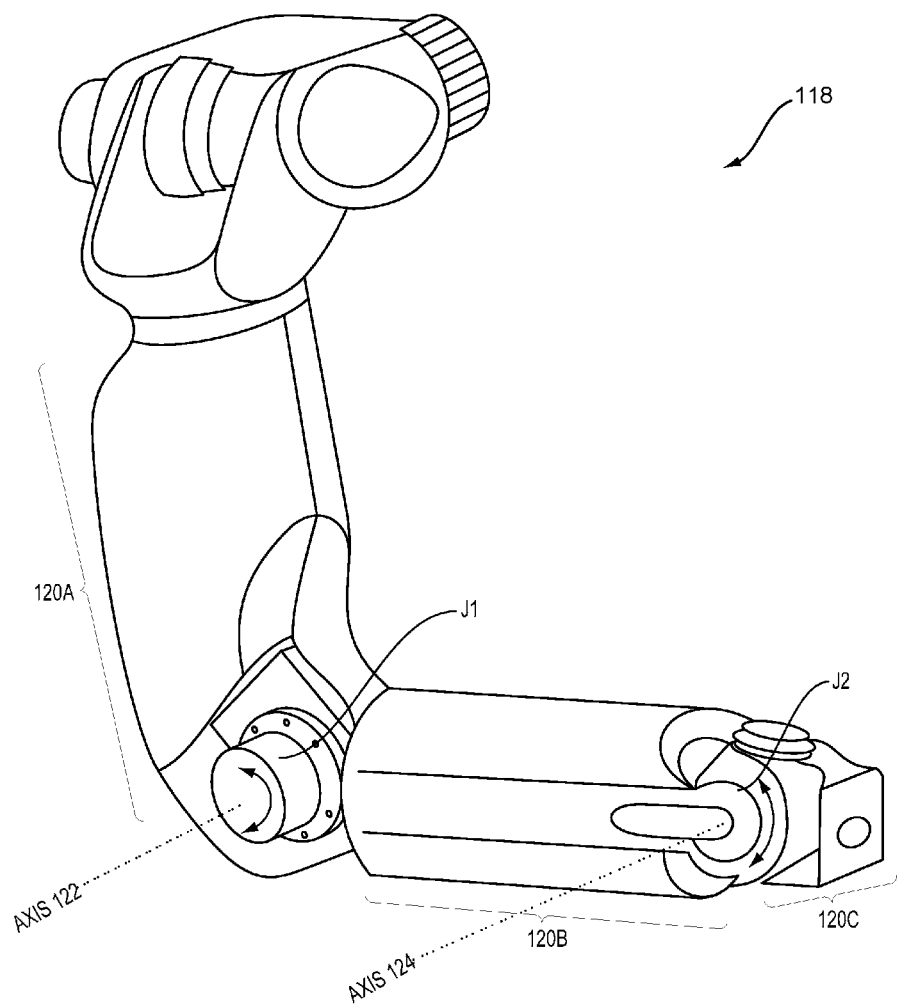

A robotic system 100 may take on various forms. To illustrate, refer to FIG. 1B showing an example robotic arm 118. As shown, the robotic arm 118 includes movable component(s) 116 such as appendages 120A, 120B, and 120C, among others. Additionally, the robotic arm 118 includes joints J1 and J2, each coupled to one or more actuators (not shown) such as actuator(s) 114. The actuators in joints J1 and J2 may operate to cause movement of various movable component(s) 116 such as appendages 120A, 120B, and 120C. For example, the actuator in joint J1 may cause movement of appendage 120B about axis 122 (e.g., resulting in rotation about an axis of joint J1). Whereas, the actuator in joint J2 may cause movement of appendage 120C about axis 124 (e.g., resulting in rotation about an axis of joint J2). Other examples may also be possible.

Figure 2A:
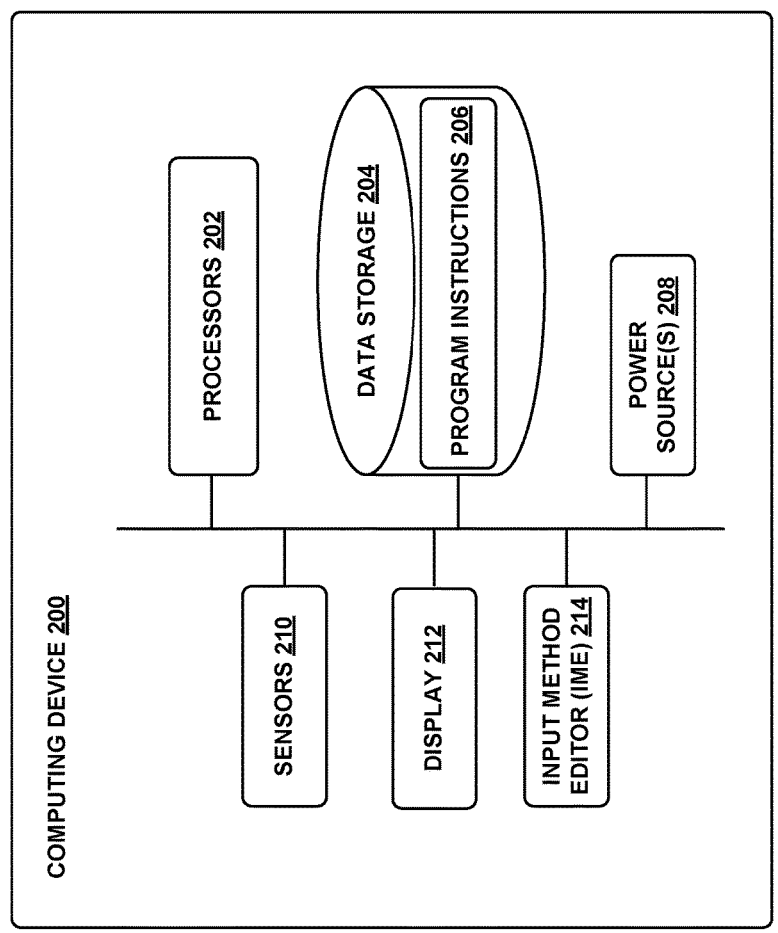
FIGS. 2A and 2B illustrate an example computing device, according to an example implementation.

FIG. 2A is a block diagram showing components of an example computing device 200 that includes one or more processors 202, data storage 204, program instructions 206, power source(s) 208, sensors 210, display 212, and Input Method Editor (IME) 214. Note that the computing device 200 is shown for illustration purposes only and computing device 200 may include additional components and/or have one or more components removed without departing from the scope of the disclosure. Further, note that the various components of computing device 200 may be arranged and connected in any manner.

Display 212 may take on any form (e.g., LED, LCD, OLED, etc.). Further, display 212 may be a touchscreen display (e.g., a touchscreen display on a tablet). Display 212 may show a graphical user interface (GUI) that may provide an application through which the user may interact with the systems disclosed herein.

Further, the computing device 200 may receive user input (e.g., from the user of the computing device 200) via IME 214. In particular, the IME 214 may allow for interaction with the GUI such as for scrolling, providing text, and/or selecting various features of the application, among other possible interactions. The IME 214 may take on various forms. In one example, the IME 214 may be a pointing device such as a computing mouse used for control of the GUI. However, if display 212 is a touch screen display, user touch input can be received (e.g., such as using a finger or a stylus) that allows for control of the GUI. In another example, IME 214 may be a text IME such as a keyboard that provides for selection of numbers, characters and/or symbols to be displayed via the GUI. For instance, in the arrangement where display 212 is a touch screen display, portions of the display 212 may show the IME 214. Thus, touch-input on the portion of the display 212 including the IME 214 may result in user-input such as selection of specific numbers, characters, and/or symbols to be shown on the GUI via display 212. In yet another example, the IME 214 may be a voice IME that may be used that receives audio input, such as from a user via a microphone of the computing device 200, that is then interpretable using one of various speech recognition techniques into one or more characters than may be shown via display 212. Other examples may also be possible.

Figure 2B:
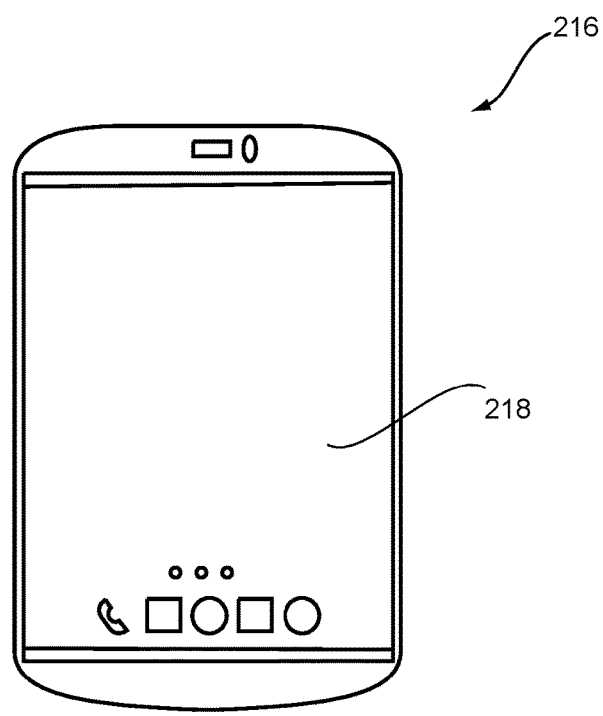

A computing device 200 may take on various forms. For instance, the computing device 200 may take the form of a desktop computer, a laptop, a tablet, a wearable computing device, and/or a mobile phone, among other possibilities. To illustrate, refer to FIG. 2B showing an example tablet 216. As shown, the tablet 216 includes touch-screen display 218 that is configured to display a GUI and receive user-input such as by way of one or more touch gestures provided by a user of the tablet 216. Note that the tablet may also include other components not shown and described herein.

Figure 3A:
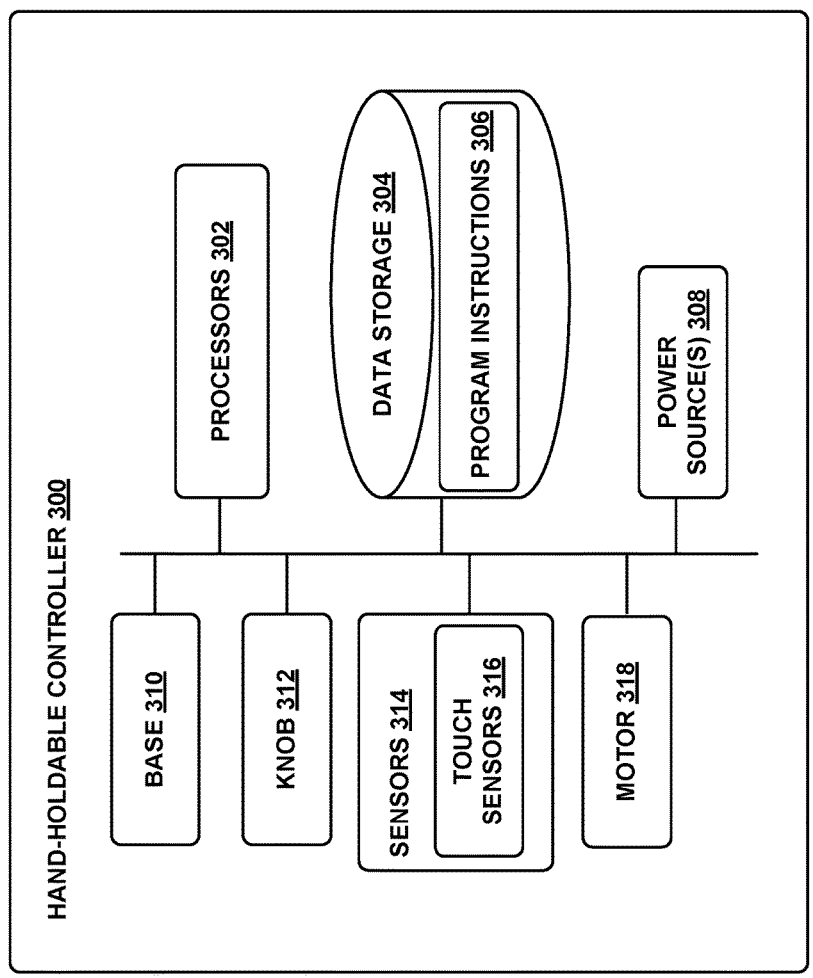
Figure 3B:
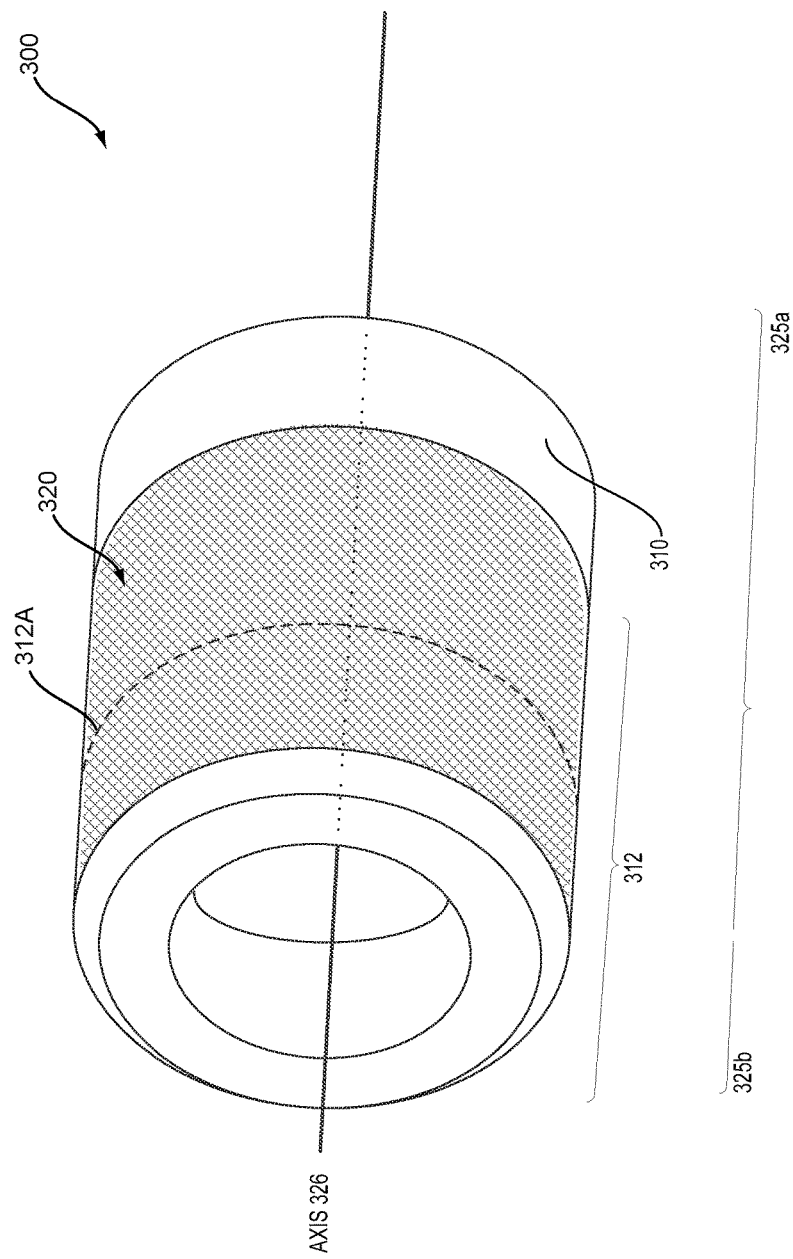

FIG. 3A is a block diagram showing functional components of a haptic hand-holdable controller 300, according to an example implementation. FIG. 3B is an illustration showing one possible implementation of a hand-holdable controller 300, which may include some or all of the components shown in FIG. 3A. A haptic hand-holdable controller 300 may also be referred to herein as a hand-holdable controller, a hand-holdable-controller system, a controller system, a wireless controller, or simply as a controller. In an example implementation, the components shown in FIG. 3A may be part of a hand-holdable controller with a motorized knob, which can also receive input via a curved touchpad on its outer surface. Other implementations, which utilize other components, are also possible.

In FIG. 3A, the hand-holdable controller 300 is shown to include one or more processors 302, data storage 304, program instructions 306, power source(s) 308, a base 310, a knob 312, sensors 314 such as touch sensors 316, and a motor 318. Note that the hand-holdable controller 300 is shown for illustration purposes only and hand-holdable controller 300 may include additional components and/or have one or more components removed without departing from the scope of the disclosure. Further, note that the various components of hand-holdable controller 300 may be arranged and connected in any manner.

Base 310 may be arranged so as to allow a user to grasp onto (e.g., hold) the hand-holdable controller 300 with one hand, while rotating the knob 312 with their other hand. Such a base 310 may be any shape, size, and/or form. Additionally or alternatively, the base 310 may be arranged to be positioned on and/or coupled to a surface or a robot joint (or another entity). With this arrangement, the user would not necessarily have to grasp onto the base 310 (e.g., so as to hold the controller 300) and could thus rotate the knob 312 with the controller 300 essentially positioned on and/or coupled to the entity. In a further aspect, this base 310 may be coupled to one or more other components of the hand-holdable controller 300, and/or may be integrated as part of a controller housing (e.g., that extends into a center cavity in the knob 312 such that the knob 312 can rotate about the portion of the housing that extends from the base 310).

Rotatable knob 312 can take on various forms, such as the cylindrical form shown in FIG. 3B, or a conical form, among other possibilities. References herein to a "cylindrical" knob or other "cylindrical" components of the controller should be understood to encompass cylindrical, conical and other forms of the knob 312 and/or other component. With such example arrangements, the controller 300 may be thus configured so that a user can provide input to the controller 300 by way of rotating the knob 312 about (e.g., relative to) the base 310. For example, the degree and/or speed of rotation of the knob 312 may provide input for control of, e.g., a robotic device.

Further, the hand-holdable controller 300 may include one or more sensors 314 such as any of the example sensors discussed above in the context of the sensor(s) 110 of robotic system 100. For instance, the hand-holdable controller 300 may include touch sensors 316 such as capacitive sensors, for example. The touch sensors 316 may be positioned and/or integrated within the knob 312 and/or within other components of the hand-holdable controller 300. For instance, the touch sensors 316 may be arranged to detect touch on one or more surfaces of the knob 312. To do so, the touch sensors 316 could, for example, take the form of a curved touchpad arranged along at least a portion of the one or more surfaces. With such example arrangements, touch data received via these touch sensors 316, such as during rotation of the knob 312, may be used to control various aspects of the robotic system 100 (e.g., via the computing device 200) and/or various aspects of the computing device 200 as further discussed below.

In an example implementation, such as that shown in FIG. 3B, the hand-holdable controller 300 may rotate about a central axis 326, and the touch sensors may be arranged to provide a curved touchpad 320, which may also be referred to as a cylindrical touch surface. In FIG. 3B, the cylindrical touch surface 320 is indicated by the crosshatch pattern on the surface of the knob 312. Further, in some implementations, the cylindrical touch surface 320 can extend around the entire outer surface of the knob (or portions thereof), such that the touch surface is a full cylinder (e.g., with no gaps in touch sensing anywhere in the circumference of the knob 312).

The hand-holdable controller 300 may additionally or alternatively include other tactile sensors as well. For example, hand-holdable controller 300 may include any sensor that generates information arising from physical interaction with the environment of the hand-holdable controller 300, such as capacitive sensors, positional feedback sensors, pressure sensors, proximity sensors, strain gauges, force sensors, temperature sensors, magnetic sensors, or others. For example, the hand-holdable controller 300 may include a proximity sensor (e.g., a Hall-effect sensor or an infrared sensor) to detect the presence of objects near the hand-holdable controller 300 but that are not in contact with the hand-holdable controller 300.

In some implementations, the hand-holdable controller 300 may not include any mechanical or structural interface features (e.g., mechanical buttons, switches, jacks, connectors, or controls), other than the knob 312. In such an implementation, the rotation of the knob 312 and tactile or touch input may be the only forms of user input that are possible via the controller 300. Alternatively, the hand-holdable controller 300 may include other interface features (not shown in the Figures) in addition to the knob 312. For example, the hand-holdable controller 300 may include a power switch or button, or other buttons, switches, jacks, connectors, or controls for providing input via the hand-holdable controller 300.

In an example implementation, the hand-holdable controller 300 may include at least one motor 318 that is operable to apply torque-generating force to knob 312. The motor 318 may be a brushed DC motor, a brushless DC motor, or an AC motor such as a synchronous electric motor or an induction motor, among other possibilities. Additionally, the motor 318 may include a motor shaft, a stationary stator, and a rotor coupled to the motor shaft such that the motor shaft is configured to deliver mechanical power to, for instance, a transmission assembly, thereby causing a rotation of the transmission assembly (which may be coupled to knob 312).

More specifically, the shaft of motor 318 may operably connected to the knob 312 and/or to a control component, such that the control component can receive an electrical input signal to control the rotation of the shaft (and thus the knob 312 as well). Alternatively, the knob 312 may be connected directly to the control component (e.g., not by way of a shaft), among other possible arrangements. For example, a slip ring or rotary transformer may be used to couple electrical signals between two parts that rotate in relation to each other, and thereby to power the rotatable portion of the hand-holdable controller 300 (e.g., to rotate the knob 312).

In a further aspect, the hand-holdable controller 300 may also include (i) potentiometers and/or variable capacitors that could be used for applications such as determining a rotary position of the knob 312 as the knob 312 rotates due to torque from the motor 318 and/or due to an external torque and/or (ii) a rotary switch that could be used to change configuration (e.g., power on or off) of the controller 300 in accordance with rotation of the knob 312 due to torque from the motor 318 and/or due to an external torque, among other components.

With the above example arrangement, the at least one motor 318 is controllable in order to vary the amount, and possibly the direction, of the torque that is applied to the knob 312. In particular, motor 318 may be operable to affect and/or resist rotation of the knob 312. For instance, the motor 318 may provide haptic feedback and/or change the "feel" of the knob 312 by applying torque to the knob in a clockwise or counter-clockwise direction. By way of example, the motor may be operable to, e.g., make rotation of the knob 312 by the user more or less difficult, to back drive a hand of a user holding the knob by way of rotational feedback, to rotate the knob 312 without additional torque being applied by a user, to replicate the feel of detents or clicks during the rotation of the knob, and/or to provide vibrational feedback, among other possibilities.

In a specific example, the controller 300 may control a joint of robotic system 100 (e.g., via computing device 200 as discussed below). In this example, the motor 318 could resist (or back drive) rotation of the knob 312 in response to a determination (e.g., by the computing device 200) that a moveable component coupled to the joint is entering a non-permissible zone (e.g., unsafe zone), such as within a threshold distance of a human for instance. Other examples are also possible.

As noted above, FIG. 3B shows an example implementation of a hand-holdable controller 300. As shown, the example hand-holdable controller 300 includes a base 310, a knob 312, and a motor (not shown) as well as any of the components discussed above in the context of hand-holdable controller 300. The controller 300 may have a proximate end 325a that is near the base 310 (illustrated in FIG. 3B near the bottom of the base 310) and a distal end 325b (illustrated in FIG. 3B near the top of the knob 312). The knob 312 may rotate or be rotated clockwise and/or counterclockwise about axis 326 in order to control a robotic system or a component thereof in various ways.

Further, touch data (or tactile data) may be received, during the rotation of the knob 312 or while the knob 312 is stationary, from one or more sensors (e.g., touch sensors 316 or tactile sensors) positioned on one or more surfaces of the knob 312. This touch data may affect the manner the robotic system 100 is being controlled. To illustrate, refer to example FIGS. 3C-3D showing different hand positions on the example hand-holdable controller 300.

Figure 3C:
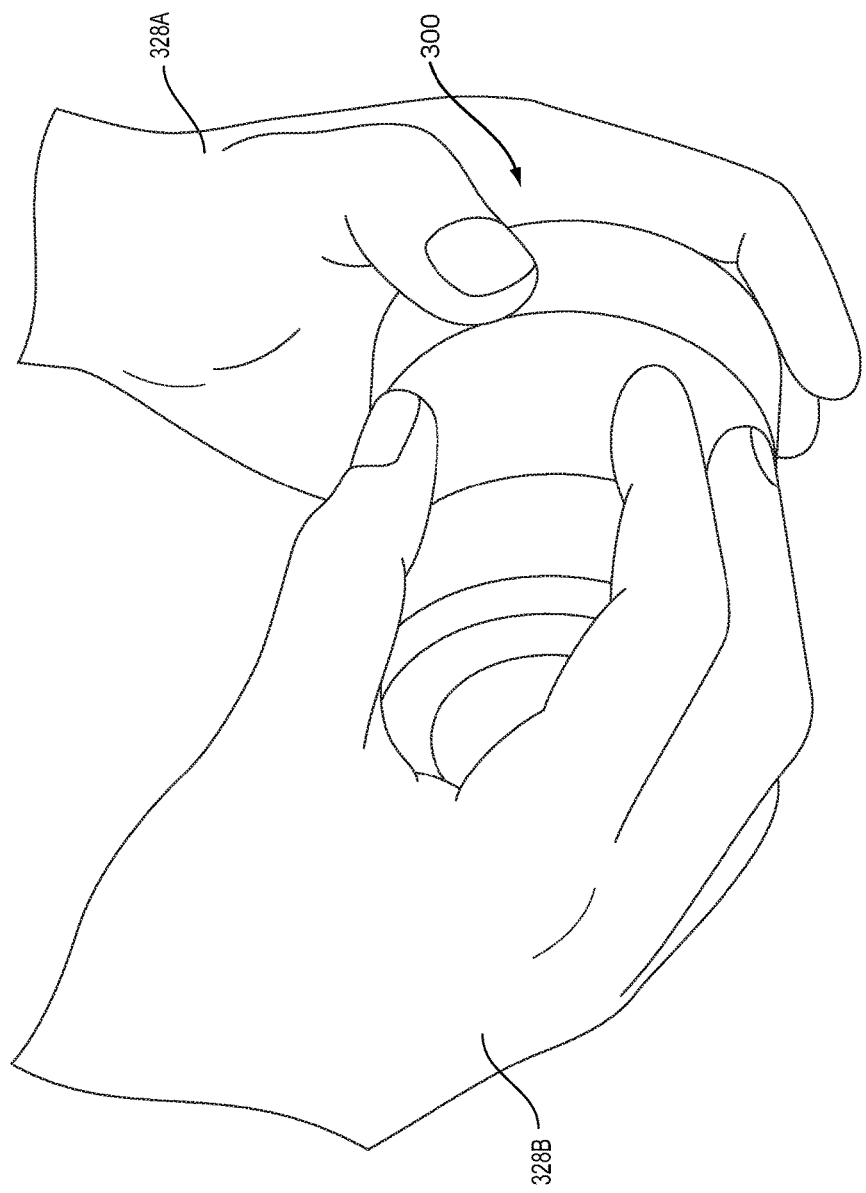

FIG. 3C shows a hand 328A of a user grasping onto the base 310 of the hand-holdable controller 300 such as for the purpose of holding onto the hand-holdable controller 300. Whereas, the other hand 328B of the user grasps onto the knob 312 such as for the purpose of providing user-input by rotation and/or touch of the knob 312. As shown, the hand 328B grasps onto a relatively large surface area of the knob 312 such as by several fingers as well as the palm on the surface area of the knob 312. The touch sensors may detect this particular touch gesture (e.g., this touch gesture may be referred to as a "full grip" or "full grasp") by the user and may provide corresponding touch data representing this particular touch gesture.

In contrast, FIG. 3D shows the hand 328A of the user grasping onto the base 310 in the same manner as in FIG. 3C. However, in this case, the other hand 328B of the user grasps onto a relatively small surface area of the knob 312 such as by placing only fingertips on the surface area of the knob 312 close to the distal end 325b. The touch sensors may detect this different particular touch gesture (e.g., this touch gesture may be referred to as a "fingertip grip" or "fingertip grasp") by the user and may provide different corresponding touch data representing this different particular touch gesture. As such, the touch illustrated in FIG. 3D may result in different control functionality of the robotic system 100 (and/or the computing device 200) than the touch illustrated in FIG. 3C. Moreover, different touch gestures may result in different control functionality even if the characteristics of the rotation of the knob 312 (e.g., amount and/or speed of rotation) are the same across different touch gestures and/or even if the component being controlled is the same across different touch gestures.

Many other example touch gestures (e.g., actions which may generate touch data, such as gestures, grips, grasps, touches, and/or other tactile information) may also be possible without departing from the scope of the disclosure. For example, the hand 328A of the user may grasp onto base 310 in the same manner as in FIGS. 3C and 3D. However, other touch gestures may include one or more of (i) a palming, (ii) a partial grip (with finger extension or retraction), (iii) a multi-finger sequence, (iv) a multi-touch, (v) a drag, (vi) a side surface hold, (vii) a side surface swipe, (viii) a fingertip only, (ix) a single tap (possibly at a certain location or within a certain area on the surface of the knob), (x) a double tap (possibly at a certain location or within a certain area on the surface of the knob), and/or (xi) a swipe or swipe pattern (possibly at a certain location or within a certain area on the surface of the knob), among other possibilities.

As one specific example, a palming grip may entail the palm of hand 328B to be placed on the top of the knob 312 (e.g., at the top of the proximate end 325a of hand-holdable controller 300). For example, an intuitive use of the palming grip may be as an indication of a stop command. Thus, the hand-holdable controller 300 may interpret touch data indicative of a palming and issue a stop command to the computing device 200 or robotic system 100 (or the hand-holdable controller 300 may send the palming touch data to the computing device 200, which in turn sends a command to stop the robotic system 100 from performing an action or to stop an action that the robotic system 100 is currently performing).

In another example of touch input, a partial grip may be interpreted from touch data that indicates a touch gesture somewhere between the grips illustrated in FIGS. 3C and 3D. For example, similar to the full grip show in FIG. 3C, all five fingers of hand 328B of the user may be used to grasp the hand-holdable controller 300 but, for the partial grip, those fingers may be placed closer to the distal end 325b (e.g., above the dividing line 312A of the knob 312 illustrated in FIG. 3B). In the partial grip (although applicable to other grips as well), touch input related to a finger retraction or finger extension may be used to generate touch data. For example, sensors (such as touch sensors 316) may detect a finger retraction (e.g., one or more fingers of hand 328B sliding or moving towards the distal end 325b of hand-holdable controller 300) or a finger extension (e.g., one or more fingers of hand 328B sliding or moving towards the proximate end 325a of hand-holdable controller 300). This finger retraction or extension may vary the commands sent to the robotic system 100. For example, a partial grip plus a finger extension may send control signals of increased magnitude as the fingers extend further. Likewise, a partial grip plus a finger retraction may send control signals of decreased magnitude as the fingers retract further. Other example touch gestures are possible and may be programmable (e.g., via IME 214 or other hardware or software).

Alternatively, a partial grip may be defined in other ways. For example, a partial grip may be defined as a full grip minus one or more pieces of touch input (e.g., touch input indicative of five (or less) fingers with no touch input indicative of a palm on top of knob 324).

In another example of touch input, a finger sequence may be used. For example, touch input indicative of the fingers of hand 328A being placed in a certain sequence may be used to generate touch data. For example, placing the five fingers down in a pattern may be identified and used. For example, a touch input indicative of the user touching the knob 324 first with the thumb and then subsequently with each finger of hand 328a may be used to power the device on or off, or accomplish any other functions. Likewise, any other finger sequence could be identified and used. For example, touch input indicative of a single finger tap (or thumb tap or palm tap) on any touch-sensitive surface could be used. Likewise, touch input related to a swipe could be used. For example, an index finger of hand 328B may be placed on top of knob 324 and swiped in a pattern (e.g., a clockwise pattern) to generate touch data.

Touch gestures can be used in combination to vary the control signals sent to the robotic system 100. For example, a full grip being performed simultaneously with a rotation of the knob 312 may actuate a joint at a high speed. By adding in a touch gesture (e.g., a fingertap) to the full grip and rotation, the control signal may be varied. For example, the speed or magnitude of the control signal may be varied. Similarly, a different component may be controlled by the additional touch gesture (e.g., the fingertap may generate a control signal to close a gripper).

Other examples of touch input that may be used to generate touch data include, for example, a multi-touch (e.g., a combination of touches, such as a full grip followed by a palming, a drag (e.g., an identified grip followed by a dragging motion), a side surface hold (e.g., two fingers of hand 328B placed and held alongside knob 312), and a side surface swipe (e.g., two fingers of hand 328B placed alongside knob 312 and swiped in a clockwise manner). Of course, many other examples of touch input are possible. Also, note that feedback (e.g., vibrational feedback, clicks, detents) could be provided by the controller 300 in response to transitions between such touch inputs.

Figure 4:
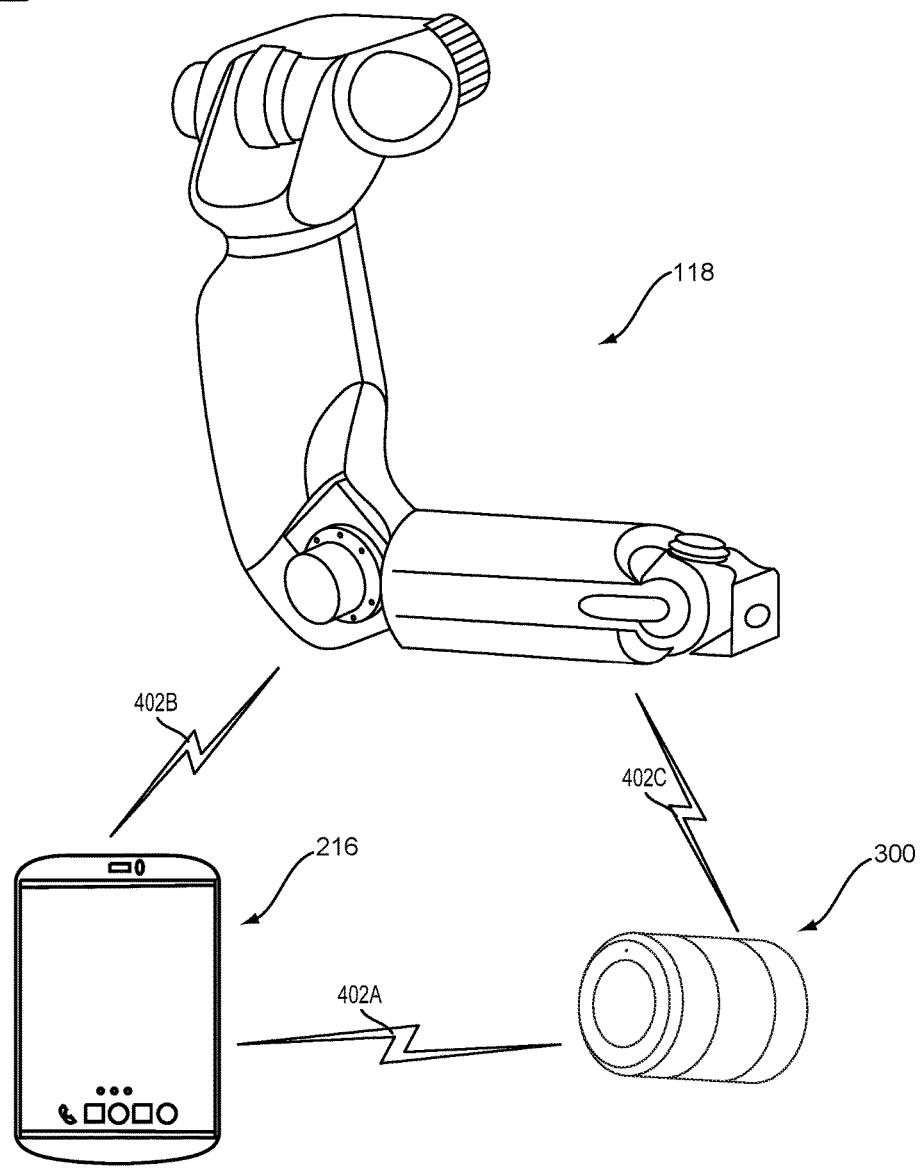
FIG. 4 illustrates example communication links, according to an example implementation.

Robotic system 100, computing device 200, and/or hand-holdable controller 300 may communicate with each other in various ways. To illustrate, refer to FIG. 4 showing an example arrangement 400 including communication links 402A, 402B, and 402C that provide for exchange of information between the various systems. For instance, communication link 402A provides for communication between example hand-holdable controller 320 and tablet 216, communication link 402B provides for communication between tablet 216 and robotic arm 118, and communication link 402C provides for communication between robotic arm 118 and example hand-holdable controller 320. Note that other arrangements may also be possible as some communication links may be removed and other communication links may be added such as for communication with other devices not discussed herein.

Communication links 402A, 402B, and 402C may include wired links and/or wireless links (e.g., using various wireless transmitters and receivers). A wired link may include, for example, a parallel bus or a serial bus such as a Universal Serial Bus (USB). A wireless link may include, for example, Bluetooth, NFC, IEEE 802.11(IEEE 802.11 may refer to IEEE 802.11-2007, IEEE 802.11n-2009, or any other IEEE 802.11 revision), Cellular (such as GSM, GPRS, CDMA, UMTS, EV-DO, WiMAX, HSPDA, or LTE), or Zigbee, among other possibilities. Furthermore, multiple wired and/or wireless protocols may be used, such as "3G" or "4G" data connectivity using a cellular communication protocol (e.g., CDMA, GSM, or WiMAX, as well as for "WiFi" connectivity using 802.11).

In other examples, the arrangement may include access points through which the various systems may communicate with a cloud server. Access points may take various forms such as the form of a wireless access point (WAP) or wireless router. Further, if a connection is made using a cellular air-interface protocol, such as a CDMA or GSM protocol, an access point may be a base station in a cellular network that provides Internet connectivity via the cellular network. Other examples are also possible.

In an example implementation, the hand-holdable controller 300 may be configured to receive instructions (e.g., from computing device 200) indicating an operational mode for the hand-holdable controller 300 (e.g., for the rotatable knob 312), so as to essentially load the operational mode onto the controller 300. In some embodiments, the operational mode may be pre-programmed, may change or be set based on touch input, or may change or be set based on other criteria (e.g., based on sensor information such as inertial attitude data from an inertial measurement unit, gyroscope, and/or accelerometer). Such an operational mode may define operational parameters of the motor (e.g., motor 318) of the hand-holdable controller 300. As such, different operational modes may provide different "feels" to the knob by varying the haptic characteristics of the knob 312. In particular, different "feels" can be provided by varying the torque applied to the knob as it rotates and/or otherwise varying when and how torque is applied to the knob 312 and/or by varying the type (or type of control) of motor 318 (e.g., by using a position rotation motor, a continuous rotation motor, a linear motor, etc.).

For example, a given operational mode may specify a specific amount of turning resistance, or in other words, a specific amount of torque that counters rotation by the user (making it harder or easier for the user to turn the knob). In another example, an operational mode may specify a rotationally-varying torque profile, which varies the amount of resistance to turning as the knob rotates. In some embodiments, a positional rotation servomotor may be used where the torque rating of the servomotor at a particular position must be overcome to turn the knob. Other examples are also possible.

In another aspect, a given operational mode may specify a range of rotation to which the knob 312 is restricted. To do so, an operational mode may define the number of degrees of rotation from a base orientation that are permissible in one or two directions. For example, an operational mode may limit rotation to within plus or minus 45 degrees from a center point. Other examples are also possible.

In yet another aspect, a given operational mode may set limits on the speed at which the knob can turn. For instance, a given operational mode may set a maximum or minimum number of degrees per second. Further, in some implementations, an operational mode may vary the maximum or minimum speed of rotation as a function of the number of degrees the knob has rotated from a base orientation.

In yet another aspect, a given operational mode may indicate whether or not to apply a return-to-center function, which returns the knob to a base orientation when certain conditions are met. For example, a return-to-center function may rotate the knob back to a base orientation whenever input data from the touch sensors on the knob indicates that the user has released the knob. As another example, a return-to-center function may only respond to release of the knob by rotating the knob back to the base orientation in certain orientations of the knob (e.g., when the knob has been rotated by at least some threshold amount from the base orientation, or when the knob has reached a rotation limit).

In yet another aspect, a given operational mode may specify certain orientations or a certain range of rotation during which free spin of the knob should be allowed. In particular, when the knob is put in a free-spin mode, the motor may be disabled such that the knob is allowed to rotate freely about the stator of the motor. An operational mode may also specify certain trigger events that trigger the enabling or disabling of free-spin mode. For example, an operational mode could define a certain touch gesture or gestures that enable and/or disable the free-spin mode. Other examples are also possible.

Other haptic parameters may also be adjusted or set by a given operational mode. For example, the hand-holdable controller may be configured to provide a variable resistance through customizable arc sizes of various sizes. As a specific example, a full (or partial) rotation of the knob could be divided into a variable number of arcs, and each arc could be of various sizes. Each of the variable number of arcs could be defined to have a specific feel (e.g., one or more operational modes, such as resistance levels, speed, detents or no detents, etc.). Other examples are also possible.

In a further aspect, an operational mode may also specify how touch input that is received via a knob controller should be interpreted and/or translated into control signals for a robot system. For example, an operational mode may define one or more touch gestures that are available for use in the operational mode, and how these touch gestures should be interpreted. Various types of touch gestures may be defined and mapped to control functions, depending upon the particular implementation.

In some cases, an operational mode may define one or more touch gestures that can be used to switch from the operational mode to one or more other operational modes. Additionally or alternatively, touch gestures that place a knob controller into a given operational mode may be defined globally, such that the controller can be placed into the given operational mode from any other operational mode. In either case, touch gestures may be used to vary the feel of the knob as it is rotated, and/or to vary manner in which rotation of the knob 312 is interpreted into robot control signals. For instance, control signals sent via rotation of the knob may vary based on different manners in which a user gestures or grasps the knob 312 and/or may vary based on the location of the touch gesture along the one or more surfaces of the knob 312, among other possibilities.

According to an example implementation, the hand-holdable controller 300 may detect a rotation of the control knob (e.g., knob 312), and may indicate that rotation of the knob to the computing device 200. Additionally or alternatively, the hand-holdable controller 300 may provide output data to a controller application running on computing device 200, which is indicative of detected touch data (e.g., during rotation of the knob). As such, the computing device 200 may determine the rotation of the knob 312 and/or touch gestures performed on the knob 312, and may responsively generate corresponding control signals for another device (e.g., robotic system 100) in accordance with the rotation and/or detected touch.

To control a device, such as robotic system 100, the computing device 200 may exchange messages with the robotic system 100 (e.g., via communication link 402B). The messages may include commands that indicate the particular component to which the robotic system 100 should send control signals. The messages may also include commands that indicate the particular operations that should be carried out by the particular component. As discussed, these particular operations are based on an interpretation of the input data received by the computing device 200 from the hand-holdable controller 300.

Although reference is made throughout to a hand-holdable controller, this disclosure is not limited to hand-holdable controllers. For example, the controller 300 could attach to a vertical surface (e.g., via a mechanical and/or magnetic attachment system). In another example, the controller 300 could attach directly to a device (or portion of a device) it is controlling, such as a speaker, a robot arm, a motorcycle, a bicycle, a lighting system, or another controllable device.

Figure 5:
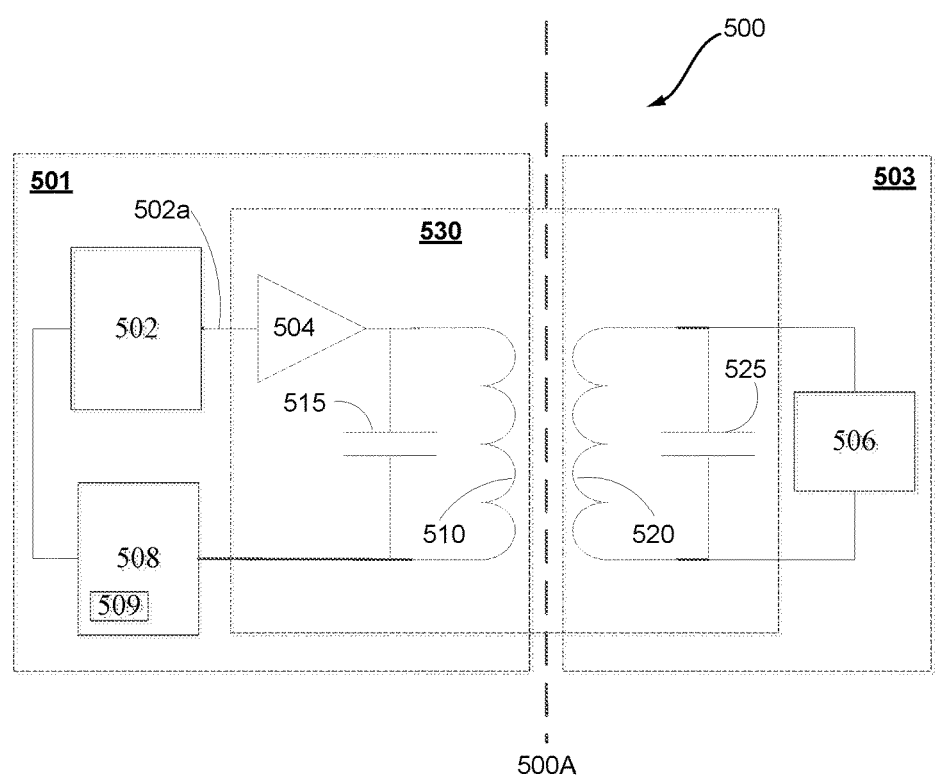
FIG. 5 illustrates a block diagram of an example rotary transformer, according to example implementations.

FIG. 5 illustrates a block diagram of an example rotary transformer 500, according to example implementations. FIG. 5 includes an axis of rotation 500A, a primary transformer component 501, a source 502, a signal 502a, a secondary transformer component 503, an amplifier 504, a modulator 506, a demodulator 508 including demodulation circuitry 509, a primary winding 510, a first capacitor 515, a secondary winding 520, and a second capacitor 525, and a resonant oscillator 530. The source 502 may be an external power source, an external frequency generating source (e.g., a clock oscillator of a processor), or another source, depending on the implementation. The source 502 may output a signal 502a, such as a drive signal.

As shown in FIG. 5, the resonant (or harmonic) oscillator 530 comprises a frequency determining element ("FDE") and an amplifier 504. The FDE is inherently resonant at a particular frequency and imposes either a minimum or maximum phase shift to an applied sinusoidal signal at that frequency. In some implementations, the FDE includes (i) the first capacitor 515 electrically connected in parallel with the primary winding 510 and (ii) the second capacitor 525 electrically connected in parallel with the secondary winding 520.

The amplifier 504 provides gain to compensate for losses in the circuit. The amplifier 504 also provides additional phase shift. In some implementations, the amplifier 504 may provide additional phase shift such that the net phase shift at the resonant frequency is 360 degrees. The resonant oscillator 530 (i.e., the combination of the FDE and amplifier 504) thus results in positive feedback and sustained oscillation.

In some implementations, the resonant oscillator 530 circuitry includes an amplifier on the primary side and an FDE that is distributed between the primary and secondary sides. Power and/or a fixed-frequency signal generator (e.g., an oscillator of a microprocessor) is available from an external source, such as source 502. The FDE includes the primary winding 510 and the secondary winding 520 of the rotary transformer (providing the inductance) and a capacitor connected in parallel with each winding, illustrated in FIG. 5 as the first capacitor 515 connected in parallel with the primary winding 510, and the second capacitor 525 connected in parallel with the secondary winding 520. In alternative implementations, the capacitors may be connected in series with the windings.

Because of the magnetic coupling between the primary winding 510 and the secondary winding 520, the two halves act as a single inductor-capacitor tank circuit. Thus, by changing the inductance and/or the capacitance on either the primary side 501 or the secondary side 503, the frequency of the oscillations can be varied. In particular, changing the capacitance on the secondary side 503 will change the oscillation frequency, which can be detected on the primary side 501. In other words, information is received at the primary side 501 (i.e., information has been transferred across the barrier from secondary to primary) by simply changing the capacitance on the secondary side 503.

Another effect of the magnetic coupling between the primary side 501 and the secondary side 503 is that energy supplied by the amplifier 504 on the primary side 501 can be extracted on the secondary side 503 to power other circuits (e.g., sensors, modulators, etc.). The exact frequency of the oscillations has little effect on the transfer of power across the transformer, so changing the frequency within a limited range will not unduly affect the power transfer.

With this arrangement, data transmission can occur by varying, or modulating, the resonant frequency in a way that represents information to be passed. Varying the resonant frequency can be done by varying either the inductance or the capacitance of the resonant oscillator 530. Varying the resonant frequency may occur in different ways depending on whether the data transmission is analog or digital. For example, in an analog system, a variation in frequency may be effected with a varactor diode (i.e., modulator 506 may include a varactor diode), which is a diode designed to vary its junction capacitance in proportion to an applied voltage. In a digital system, only two distinct frequencies are needed so a variation in frequency may be effected, for example, by switching a third capacitor in and out of the circuit (e.g., modulator 506 may include a capacitor and a switch). Modulator 506 may also include a processor, data storage, and program instructions to modulate the signal.

After data modulation at the secondary side 503, the primary side 501 must detect and interpret the transmission in a useful way (e.g., demodulate the signal). In some implementations, a demodulator 508 or similar circuitry that provides an output (e.g., a voltage) that is proportional to the incoming frequency (e.g., an FM demodulator) may be used to demodulate the signal. For digital communication, the demodulator 508 output may be applied to a threshold detector such that any frequency that results in a demodulator 508 output above the threshold is considered to represent a logical 1, while any frequency below that threshold represents a logical 0.

In some implementations, such as those with relatively lower data rates, demodulation may be accomplished by using a "frequency counter" approach in which a gated counter circuit counts the number of oscillations within a predetermined time interval or sampling interval. This process is performed repeatedly and after each sampling interval the cycle count may be made available to a processor, data storage, and program instructions. After each sampling interval, the counter is reset to zero in preparation for the next sampling interval.

In some implementations, the demodulator 508 may include demodulation circuitry 509. For example, demodulation circuitry may include a phase-locked loop (or portions of a phase-locked loop) that may be assist with demodulation. For example, demodulation may be accomplished by locking a phase-locked loop to the primary winding current waveform to detect short-term changes in phase (i.e., phase relative to the long-term average, which is what the voltage-controlled oscillator of the phase-locked loop would represent). In other implementations, the modulator 506 may be changing the phase of the current of the primary winding relative to the drive signal of the fixed-frequency signal generator. Thus, the fixed-frequency generator may provide the phase reference (as the drive signal) for the demodulator and no need exists to reconstruct the phase reference with a full phase-locked loop. In these implementations, a partial phase-locked loop may be used that includes, e.g., a phase detector, a low-pass filter, and a threshold detector (i.e., a partial phase-locked loop that does not include the voltage-controlled oscillator). In some implementations where the fixed-frequency generator provides the phase reference, the partial phase-locked loop may include only a phase detector and a low-pass filter.

Beneficially, variations in amplitude have minimal effect on the data transfer. For example, variations in parameters such as the power supply voltage on the primary side 501, power consumption on the secondary side 503, the degree of coupling (e.g., due to mechanical imperfections), and noise will have minimal effect on the data transfer.

In some implementations, data is transferred from one or more switches, sensors (digital or analog), and/or other sources from the secondary side 503 to the primary side 501. In digital communications, it may be more efficient to format the data into a serial stream. For example, the data may be formatted as asynchronous characters or as a self-clocking synchronous stream. For example, a self-clocking synchronous stream may be accomplished using phase encoding or Manchester coding.

In some implementations, data may need to be transferred from the primary side 501 to the secondary side 503, either in lieu of or in addition to secondary-to-primary transfer. If in lieu of secondary-to-primary transfer, this can be accomplished by swapping the positions of the modulator 506 and demodulator 508. In this implementation, the oscillator frequency is modulated by a circuit on the primary side 501 and demodulated on the secondary side 503. If in addition to secondary-to-primary transfer, a modulator 506 and demodulator 508 may be provided on both sides to enable communication in both directions. In some implementations, the rotary transformer 500 may operate in full duplex mode where both modulators 506 are active at the same time. In other implementations, the rotary transformer 500 may operate in half duplex mode where only one side transmits at any given time (e.g., a protocol may be used such that the two sides take turns using the channel).

The modulator 506 may be used to vary the resonant frequency of the circuit in response to an drive signal. The modulator 506 may vary depending on the implementation and methods of varying the resonant frequency may include using, e.g., a switched capacitor, a switched inductor, a variable capacitor and/or a variable inductor. For example, a varactor diode may be used, which acts as a voltage-controlled capacitor. As an example of a variable inductor method, a saturable core inductor may be used, where varying the DC current through the inductor winding varies its inductance. In some implementations, the saturable core inductor may be the rotary transformer core, while in other implementations the saturable core inductor may not be the rotary transformer core.

In some implementations, a phase modulation scheme may be used in place of a frequency modulation scheme. In the phase modulation scheme, the resonant oscillator 530 is driven by a source 502 such as a fixed-frequency signal (e.g., a clock oscillator of a processor) that outputs a drive signal. The phase relationship between the oscillating current in the resonant oscillator 530 circuit and the drive signal is dependent on the relationship between the driving frequency and the natural resonance of the resonant oscillator 530 circuit. Thus, by changing the tuning of the resonant oscillator 530 circuit, the phase of the oscillations is modulated instead of the frequency. Demodulation may occur in a similar manner to that described previously.

In some implementations, the resonant frequency of the resonant circuit is varied. Varying the resonant frequency of the resonant circuit affects the phase relationship between the drive signal output by the fixed-frequency signal generator (which imposes a voltage on the resonant circuit) and the resulting current flowing in the resonant circuit. This phase relationship (i.e., between the drive signal and the resonant current) is detected by the demodulator. Beneficially, this data communication may occur simultaneously with power transmission between the transformer components.

III. Illustrative Methods

Figure 6:
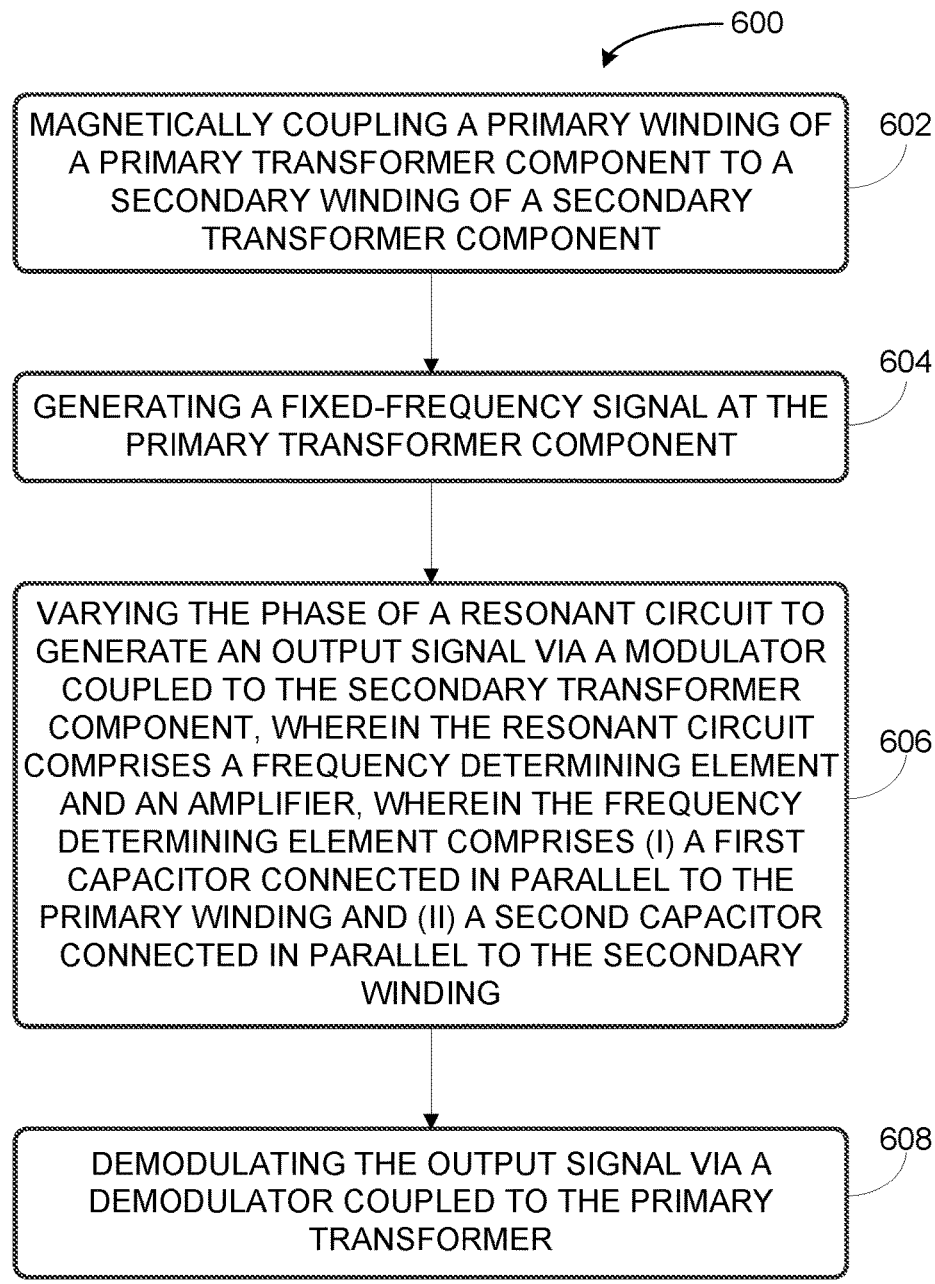
FIG. 6 is an example flowchart for transmitting a signal with a rotary transformer, according to example implementations.

FIG. 6 is an example flowchart for transmitting a signal with a rotary transformer, according to example implementations.

Method 600 shown in FIG. 6 (and other processes and methods disclosed herein) presents a method that can be implemented within an arrangement involving, for example, the robotic system 100, the robotic arm 118, the computing device 200, tablet 216, hand-holdable controller 300, example hand-holdable controller 320 and/or within the arrangement 400 shown in FIG. 4 or rotary transformer arrangement 500 shown in FIG. 5 (or more particularly by one or more components or subsystems thereof, such as by a processor and a non-transitory computer-readable medium having instructions that are executable to cause the device to perform functions described herein). Additionally or alternatively, method 600 may be implemented within any other arrangements and systems.

Method 600 and other processes and methods disclosed herein may include one or more operations, functions, or actions as illustrated by one or more of blocks 602-608. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 600 and other processes and methods disclosed herein, the flowchart shows functionality and operation of one possible implementation of present implementations. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example.

The computer readable media may also be any other volatile or non-volatile storage systems. The computer readable medium may be considered a computer readable storage medium, for example, or a tangible storage device. In addition, for the method 600 and other processes and methods disclosed herein, each block in FIG. 6 may represent circuitry that is wired to perform the specific logical functions in the process.

At block 602, method 600 involves magnetically coupling a primary winding of a primary transformer component to a secondary winding of a secondary transformer component.

In an example implementation, the primary transformer component may be a stationary component of a haptic controller, such as the base 310 of the haptic controller 300. The secondary transformer component may be a rotatable component of a haptic controller, such as the rotatable knob 312 of the haptic controller 300.

At block 604, method 600 involves, generating a fixed-frequency signal at the primary transformer component. In some implementations, a clock oscillator of a processor may be used to generate the fixed-frequency signal.

At block 606, method 600 involves varying the phase of a resonant circuit to generate an output signal via a modulator coupled to the secondary transformer component. In some implementations, the resonant circuit may include a frequency determining element and an amplifier. The frequency determining element may be an inductor-capacitor tank circuit, such as a first capacitor connected in parallel to the primary winding and a second capacitor connected in parallel to the secondary winding. The modulator may be a third capacitor that is switched in and out of the resonant circuit.

At block 608, method 600 involves demodulating the output signal via a demodulator coupled to the primary transformer. The demodulator may be an FM demodulator, a frequency counter demodulator, a full or partial phase-locked loop, or any other type of demodulator.

IV. Additional Features

While control of the robotic system 100 was discussed above generally in the context of controlling joints of the robotic system 100, such discussion should not be seen as limiting as the example implementations discussed herein may be used for control of a variety of different robotic system 100 components, as well as components/aspects of other devices and machines.

V. Conclusion

The present disclosure is not to be limited in terms of the particular implementations described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The example implementations described herein and in the figures are not meant to be limiting. Other implementations can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The particular arrangements shown in the figures should not be viewed as limiting. It should be understood that other implementations can include more or less of each element shown in a given figure. Further, some of the illustrated elements can be combined or omitted. Yet further, an example implementation can include elements that are not illustrated in the figures.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims.

We claim:

1. A rotary transformer, comprising:
   a primary transformer component comprising a primary winding;
   a secondary transformer component comprising a secondary winding, wherein the secondary transformer component is configured to rotate relative to the first transformer component about a central axis;
   wherein the primary winding is magnetically coupled to the secondary winding;
   a fixed-frequency signal generator coupled to the primary transformer component configured to output a drive signal;
   a resonant circuit comprising a frequency determining element and an amplifier, wherein the frequency determining element comprises (i) the primary winding connected in parallel to a first capacitor and (ii) the secondary winding connected in parallel to a second capacitor, wherein the resonant circuit comprises a resonant frequency corresponding to the frequency determining element and a resonant current;
   a modulator coupled to the secondary transformer component and configured to accept an input signal and vary the resonant frequency of the resonant circuit based on the input signal; and
   a demodulator coupled to the primary transformer component and configured to detect changes in a phase relationship between the drive signal and the resonant current, wherein the demodulator generates an output signal based on the changes in the phase relationship.

2. The rotary transformer of claim 1, wherein the modulator comprises a capacitor switching circuit, a switched capacitor, a switched inductor, a variable capacitor, or a variable inductor.

3. The rotary transformer of claim 1, wherein the demodulator comprises a phase detector.

4. The rotary transformer of claim 1, wherein the modulator is further configured to format data into a serial stream.

5. The rotary transformer of claim 4, wherein the modulator formats the data into a serial stream via a self-clocking synchronous stream using Manchester coding.

6. The rotary transformer of claim 1, wherein the primary transformer component comprises a stationary component of a haptic controller and the secondary transformer component comprises a rotatable component of the haptic controller.

7. The rotary transformer of claim 1, wherein the rotatable component is a rotatable knob.

8. A transformer, comprising:
a primary transformer component comprising a primary winding;
a secondary transformer component comprising a secondary winding, wherein the primary winding is magnetically coupled to the secondary winding;
a resonant oscillator comprising a frequency determining element and an amplifier, wherein the frequency determining element comprises (i) the primary winding connected in parallel to a first capacitor and (ii) the secondary winding connected in parallel to a second capacitor;
a modulator coupled to the secondary transformer component and configured to vary the resonant frequency of the resonant circuit based on an input signal; and
a demodulator coupled to the primary transformer component and configured to detect changes in a phase of the resonant current over time that are caused by a change in the drive signal, wherein the demodulator generates an output signal based on the detected changes.

9. The transformer of claim 8, wherein the modulator comprises capacitive switching circuitry, a switched capacitor, a switched inductor, a variable capacitor, or a variable inductor.

10. The transformer of claim 8, wherein the demodulator comprises phase-locked loop circuitry.

11. The transformer of claim 8, wherein the modulator is further configured to format data into a serial stream.

12. The transformer of claim 11, wherein the modulator formats the data into a serial stream via a self-clocking synchronous stream using Manchester coding.

13. The transformer of claim 8, wherein the primary transformer component comprises a stationary component of a haptic controller and the secondary transformer component comprises a rotatable component of the haptic controller.

14. The transformer of claim 8, wherein the rotatable component is a rotatable knob.

15. The transformer of claim 8, wherein the demodulator comprises frequency counter circuitry that counts the number of oscillations within a predetermined time interval.

16. A method comprising:
magnetically coupling a primary winding of a primary transformer component to a secondary winding of a secondary transformer component;
generating a fixed-frequency signal at the primary transformer component;
varying the resonant frequency of a resonant circuit based on an input signal via a modulator coupled to the secondary transformer component, wherein the resonant circuit comprises a frequency determining element and an amplifier, wherein the frequency determining element comprises (i) a first capacitor connected in parallel to the primary winding and (ii) a second capacitor connected in parallel to the secondary winding;
generating, by a demodulator coupled to the primary transformer component, an output signal based on changes in a phase relationship between the drive signal and the resonant current; and
transferring power between the primary transfer component and the secondary transformer component.

17. The method of claim 16, wherein the modulator comprises capacitive switching circuitry.

18. The method of claim 16, wherein the demodulator comprises phase-locked loop circuitry.

19. The method of claim 16, wherein the modulator is further configured to format data into a self-clocking synchronous stream using Manchester coding.

20. The method of claim 16, wherein the primary transformer component comprises a stationary component of a haptic controller and the secondary transformer component comprises a rotatable component of the haptic controller.

21. A rotary transformer, comprising:
a primary transformer component comprising a primary winding and a first capacitor connected in parallel, and a fixed-frequency signal generator, an amplifier, and a demodulator coupled to the primary winding; and
a secondary transformer component comprising a secondary winding, a second capacitor, and a modulator connected in parallel;
wherein the primary winding is magnetically coupled to the secondary winding, and wherein the secondary transformer component is configured to rotate relative to the first transformer component about a central axis;
wherein the primary winding connected in parallel to the first capacitor and the secondary winding connected in parallel to the second capacitor and modulator collectively form a resonant circuit;
wherein the modulator is configured modify a resonant frequency and resonant current of the resonant circuit based on a received input signal; and
wherein the demodulator is configured to detect changes in a phase relationship between a drive signal of the fixed-frequency signal generator and the resonant current that result from modifications to the resonant current of the resonant circuit.

* * * * *